United States Patent
Chang et al.

(10) Patent No.: US 8,659,006 B1
(45) Date of Patent: Feb. 25, 2014

(54) TECHNIQUES FOR METAL GATE WORK FUNCTION ENGINEERING TO ENABLE MULTIPLE THRESHOLD VOLTAGE NANOWIRE FET DEVICES

(75) Inventors: Josephine B. Chang, Mahopac, NY (US); Isaac Lauer, Yorktown Heights, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/597,802

(22) Filed: Aug. 29, 2012

Related U.S. Application Data

(63) Continuation of application No. 13/588,724, filed on Aug. 17, 2012.

(51) Int. Cl.
*H01L 29/06* (2006.01)
*H01L 29/78* (2006.01)

(52) U.S. Cl.
USPC .................................... 257/27; 257/E29.255

(58) Field of Classification Search
USPC ............................................ 257/27, E29.255
See application file for complete search history.

(56) References Cited

U.S. PATENT DOCUMENTS

| | | | |
|---|---|---|---|
| 6,444,512 B1 | 9/2002 | Madhukar et al. | |
| 7,807,525 B2 | 10/2010 | Doris et al. | |
| 7,879,669 B1 | 2/2011 | Teng et al. | |
| 7,884,004 B2 | 2/2011 | Bangsaruntip et al. | |
| 8,084,308 B2 | 12/2011 | Chang et al. | |
| 2002/0074612 A1 | 6/2002 | Bulucea et al. | |
| 2008/0093699 A1 | 4/2008 | Abe et al. | |
| 2011/0133163 A1* | 6/2011 | Bangsaruntip et al. | 257/24 |
| 2011/0168982 A1 | 7/2011 | Bangsaruntip et al. | |
| 2011/0298018 A1 | 12/2011 | Yin et al. | |

(Continued)

FOREIGN PATENT DOCUMENTS

WO   WO 2012035679 A1 *   3/2012

OTHER PUBLICATIONS

K. Choi et al., "The effect of metal thickness, overlayer and high-k surface treatment on the effective work function of metal electrode," Proceedings of 35th European Solid-State Device Research Conference, ESSDERC 2005, Sep. 12-16, 2005, pp. 101-104.

(Continued)

*Primary Examiner* — William D Coleman
*Assistant Examiner* — Christine Enad
(74) *Attorney, Agent, or Firm* — Louis J. Percello; Michael J. Chang, LLC

(57) ABSTRACT

A nanowire FET device includes a SOI wafer having a SOI layer over a BOX, and a plurality of nanowires and pads patterned in the SOI layer, wherein the nanowires are suspended over the BOX; an interfacial oxide surrounding each of the nanowires; and at least one gate stack surrounding each of the nanowires, the gate stack having (i) a conformal gate dielectric present on the interfacial oxide (ii) a conformal first gate material on the conformal gate dielectric (iii) a work function setting material on the conformal first gate material, and (iv) a second gate material on the work function setting material. A volume of the conformal first gate material and/or a volume of the work function setting material in the gate stack are/is proportional to a pitch of the nanowires.

18 Claims, 5 Drawing Sheets

(56) References Cited

U.S. PATENT DOCUMENTS

2011/0315950 A1* 12/2011 Sleight et al. ............... 257/9
2013/0056833 A1* 3/2013 Takeoka ..................... 257/369
2013/0075833 A1 3/2013 Liu et al.

OTHER PUBLICATIONS

I. Ferain et al., "Metal gate thickness optimization for MuGFET performance improvement," 38th European Solid-State Device Research Conference, 2008, ESSDERC, Sep. 15-19, 2008. pp. 202-205.

M. M. Hussain et al., "Gate-First Integration of Tunable Work Function Metal Gates of Different Thicknesses Into High-k/Metal Gates CMOS FinFETs for Multi-VTh Engineering," IEEE Transactions on Electron Devices, Mar. 2010, vol. 57, No. 3, pp. 626-631.

T.-H. Kim et al., "Utilizing Reverse Short-Channel Effect for Optimal Subthreshold Circuit Design," IEEE Transactions on Very Large Scale Integration (VLSI) Systems, Jul. 2007, vol. 15, No. 7, pp. 821-829.

* cited by examiner

SPACER MATERIAL REMAINS IN UNDERCUT REGIONS

US 8,659,006 B1

TECHNIQUES FOR METAL GATE WORK FUNCTION ENGINEERING TO ENABLE MULTIPLE THRESHOLD VOLTAGE NANOWIRE FET DEVICES

CROSS-REFERENCE TO RELATED APPLICATION(S)

This application is a continuation of U.S. application Ser. No. 13/588,724 filed on Aug. 17, 2012, the disclosure of which is incorporated by reference herein.

FIELD OF THE INVENTION

The present invention relates to nanowire field-effect transistor (FET) devices, and more particularly, to techniques for gate work function engineering using a work function setting material an amount of which is provided proportional to nanowire pitch so as to enable multiple threshold voltage (Vt) devices.

BACKGROUND OF THE INVENTION

In current complementary metal-oxide semiconductor (CMOS) scaling, the use of undoped gate all around (GAA) nanowire devices is a highly investigated structure as a device choice for future CMOS. One key problem with undoped devices is the implementation of multiple threshold voltage (Vt) devices. One solution is to dope the nanowire FET. To do so, however, for aggressively scaled devices has serious drawbacks from random dopant fluctuation (RDF) effects and becomes extremely problematic as the nanowire diameter is scaled. One can also engineer gate stacks with different work functions for different Vt's. This however requires a substantial amount of process complexity.

Therefore, improved techniques for fabricating multiple Vt nanowire FET devices that avoid the above-described drawbacks would be desirable.

SUMMARY OF THE INVENTION

The present invention provides techniques for gate work function engineering in nanowire field-effect transistor (FET) devices using a work function setting material an amount of which is provided proportional to nanowire pitch. In one aspect of the invention, a method of fabricating a nanowire FET device is provided. The method includes the following steps. A semiconductor-on-insulator (SOI) wafer is provided having a SOT layer over a buried oxide (BOX). Nanowires and pads are etched in the SOI layer, wherein the pads are attached at opposite ends of the nanowires in a ladder-like configuration. The nanowires are suspended over the BOX. An interfacial oxide is formed surrounding each of the nanowires. A conformal gate dielectric is deposited on the interfacial oxide, surrounding each of the nanowires. A conformal first gate material is deposited on the conformal gate dielectric, surrounding each of the nanowires. A work function setting material is deposited on the conformal first gate material, at least partially surrounding the nanowires. A second gate material is deposited on the work function setting material, surrounding each of the nanowires to form at least one gate stack over the nanowires. A volume of the conformal first gate material and/or a volume of the work function setting material in the gate stack are/is proportional to a pitch of the nanowires.

In another aspect of the invention, a nanowire FET device is provided. The nanowire FET device includes a SOI wafer having a SOI layer over a BOX, and a plurality of nanowires and pads patterned in the SOT layer wherein the pads are attached at opposite ends of the nanowires in a ladder-like configuration, and wherein the nanowires are suspended over the BOX; an interfacial oxide surrounding each of the nanowires; and at least one gate stack surrounding each of the nanowires, the gate stack having (i) a conformal gate dielectric present on the interfacial oxide, surrounding each of the nanowires (ii) a conformal first gate material on the conformal gate dielectric, surrounding each of the nanowires (iii) a work function setting material on the conformal first gate material, at least partially surrounding each of the nanowires, and (iv) a second gate material on the work function setting material, surrounding each of the nanowires. A volume of the conformal first gate material and/or a volume of the work function setting material in the gate stack are/is proportional to a pitch of the nanowires.

A more complete understanding of the present invention, as well as further features and advantages of the present invention, will be obtained by reference to the following detailed description and drawings.

DETAILED DESCRIPTION OF PREFERRED EMBODIMENTS

Figure 1:
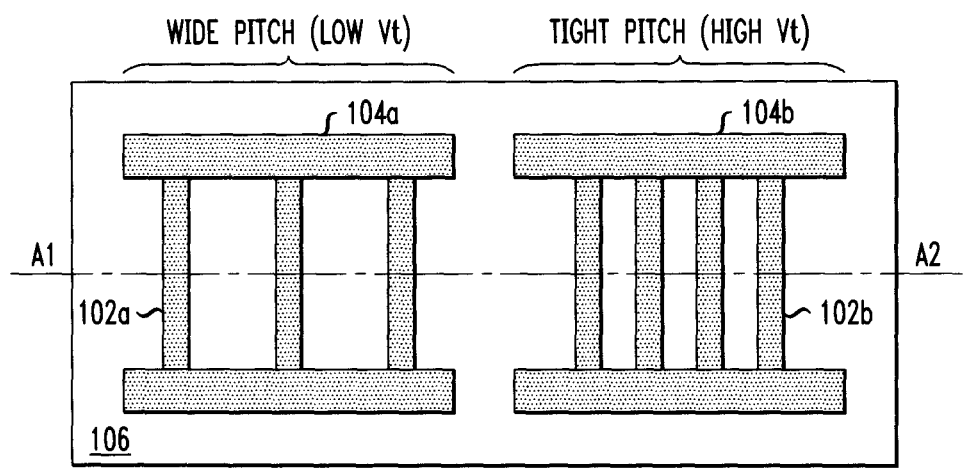
FIG. 1 is a top-down diagram illustrating a plurality of nanowires and pads having been patterned in a semiconductor-on-insulator (SOI) layer over a buried oxide (BOX) according to an embodiment of the present invention.

As described above, there are notable disadvantages associated with using doping and/or different work function gate stacks to produce multiple threshold voltage (Vt) nanowire field-effect transistor (FET) devices. Advantageously, provided herein are techniques for producing multiple Vt nanowire FET devices using a work function setting material in an amount that is modulated as a function of nanowire pitch (wire to wire pitch, where the pitch is defined as the distance from the center of one nanowire to the adjacent nanowire(s)). Namely, a thickness of the materials in the device gate stacks will be chosen such that less work function setting material ends up in the tighter pitch nanowire FETs. Thus, for smaller pitch, higher nanowire FET Vt is obtained and therefore, through nanowire pitch variation, different Vt devices may be fabricated. The technique does come at the cost of significant reduction in active width density, however if the lower Vt (wider pitch) devices are not used for a large fraction of the chip area, and this trade-off may be very preferred over the use of more complex (and yield challenging) integration schemes.

The present techniques are applicable in both gate-first and gate-last nanowire FET process flows in which a gate all around (GAA) configuration is employed. In general, a gate-first approach to nanowire FET device fabrication involves patterning one or more nanowire channels, releasing the nanowire channels from an underlying substrate, and forming a gate stack surrounding the nanowire channels. See, for example, U.S. Pat. No. 7,884,004 issued to Bangsaruntip et al., entitled "Maskless Process for Suspending and Thinning Nanowires" (hereinafter "U.S. Pat. No. 7,884,004"), the contents of which are incorporated by reference herein. A couple of different gate-last approaches have been proposed which vary depending on at what stage in the process the nanowires are formed. Accordingly, they are termed wire-first and wire-last approaches. In a gate-last wire-first approach, the nanowires are first formed, a dummy gate is then formed on the wires. The dummy gate is removed near the end of the process to be replaced by a metal gate stack. A gate-last, wire-last approach was developed to improve the precision of the nanowire patterning process so as to permit more uniform nanowires to be produced. See, for example, U.S. Pat. No. 8,084,308 issued to Chang et al., entitled "Single Gate Inverter Nanowire Mesh" (hereinafter "Chang") the contents of which are incorporated by reference herein. With a gate-last wire-last approach, precise patterning of the nanowires occurs after removal of the dummy gate.

With either gate-last approach, a dummy gate is formed early in the process and then is removed and replaced with a replacement gate. Advantageously, the present techniques are easily integrated in either a gate-first or a gate-last approach where the gate is formed over a silicon wafer.

The present techniques will be described by way of reference to FIGS. 1-10. The process illustrated is representative of the steps that may be performed after removal of the dummy gate in a gate-last wire-first approach or after nanowire patterning in a gate-first or gate-last wire-last approach (see above). Namely, in all three cases, the present process involves the fabrication of gate stacks surrounding a plurality of nanowires to fabricate a nanowire FET device(s). With a wire-last approach, a dummy gate(s) may be used to locate the fin patterning hardmask relative to the source and drain regions of the device. See, for example, Chang. However, once the dummy gate(s) have been removed, the process steps for fabricating the gate stack (also called the "replacement gate" in the gate-last approach) are the same regardless of whether a gate-first or gate-last approach is being implemented.

Thus, the present process description begins with a plurality of nanowires having been patterned on a wafer. In an illustrative example, the nanowires are patterned in a semiconductor-on-insulator (SOI) wafer with pads attached at opposite ends of the nanowires in a ladder-like configuration (i.e., wherein the nanowires resemble the rungs of a ladder). See FIG. 1. A portion of the nanowires which will be surrounded by the gate stack will serve as channels of the device (s). Those portions of the nanowires and pads extending out from the gate will serve as source and drain regions of the device. FIG. 1 provides a top-down view of these patterned nanowires and pads.

In the exemplary embodiment depicted and described below, multiple nanowire FET devices will be fabricated on the wafer (each device being formed with a different nanowire pitch). For purposes of illustrating the present techniques, two nanowire FET devices will be produced, namely a wide pitch nanowire FET and a tight pitch nanowire FET. By way of example only, a tight nanowire pitch may be from about 20 nanometers (nm) to about 40 nm, whereas a wide pitch may be from about 40 nm to about 80 nm. Of course, this configuration of devices is merely exemplary and any other combination of devices, or even a single device, may be obtained using the present techniques. As will be described in detail below, a work function setting material(s) will be used in the gate stacks of the devices. The work function setting material acts as a doping source, and by way of the present process serves to change the work function of the gate stacks. Since the work function setting material acts as a doping source, advantageously, the present process flow permits the same gate material (e.g., metal(s)) to be used in each of the devices being formed (which simplifies the fabrication process). A different work function setting material can then be employed depending, e.g., on whether an n-channel nanowire FET (NFET) or a p-channel nanowire FET (PFET) is desired. Further, metal from the gate stack will diffuse into the surrounding dielectric or gate material to change the threshold voltage of the device. In one exemplary embodiment, the more work function setting material present in the gate, the lower the threshold voltage ($V_T$) of the device would be. Thus, by adding a work function setting material to the gate stack, the threshold voltages of the resulting devices can be lowered. By way of the present techniques, more of the work function setting material will be deposited in the wide pitch devices as compared to the tight pitch devices. By modulating the volume of work function setting material proportionally to the nanowire pitch such that the volume of work function setting material is reduced as nanowire pitch decreases, multiple thresholds nanowire FET devices can be fabricated simultaneously. This is why devices having different nanowire pitch are shown in the figures so as to illustrate this aspect of the present techniques.

A SOI wafer typically includes a layer of a semiconductor material (also commonly referred to as a semiconductor-on-insulator layer or SOI layer) separated from a substrate by an insulator. According to the present techniques, the SOI layer will serve as an active layer of the device in which the nanowires and pads are patterned. When the insulator is an oxide (e.g., silicon dioxide ($SiO_2$)), it is commonly referred to as a buried oxide, or BOX. See FIG. 1 wherein nanowires 102a/102b and pads 104a/104b have been patterned in the wafer for the wide pitch and tight pitch nanowire FET devices, respectively. BOX 106 is visible beneath the patterned nanowires 102 and pads 104. A substrate is typically located beneath the BOX, but is not visible in the depiction of FIG. 1 (and for ease and clarity of description is not shown in the other figures).

The nanowires and pads (based on a composition of the SOI layer) are preferably formed from a semiconducting material, such as silicon (Si) (e.g., crystalline silicon), silicon germanium (SiGe) or silicon carbon (SiC). The nanowires and pads may be doped or undoped depending on the particular device application at hand. By way of example only, as described above, a portion of the nanowires will serve as channels of the device(s). When an NFET device is being formed it may be desirable to dope the nanowires with a p-type dopant. When a PFET device is being formed, it may be desirable to dope the nanowires with an n-type dopant. Suitable p-type dopants include, but are not limited to, boron. Suitable n-type dopants include, but are not limited to, phosphorus and arsenic. Alternatively, the nanowires and pads may be left undoped.

The process for patterning nanowires and pads in a SOI wafer are described in detail in U.S. patent application Ser. No. 13/564,121, filed by Bangsaruntip et al., entitled "Epitaxially Thickened Doped or Undoped Core Nanowire FET Structure and Method for Increasing Effective Device Width" (hereinafter "U.S. patent application Ser. No. 13/564,121"), the contents of which are incorporated by reference herein. As described in U.S. patent application Ser. No. 13/564,121 the nanowires and pads may be patterned using reactive ion etching (RIE) through a hardmask. Since the pattern of the hardmask dictates the configuration of the nanowires and pads, in the present example, the pitch of the nanowires may be set by the dimensions of the hardmask. The steps for configuring a hardmask for patterning devices with different nanowire pitch on a wafer would, given the present description, be within the capabilities of one skilled in the art.

The devices being fabricated herein are gate all around (GAA) devices meaning that the gate(s) being formed will surround a portion of each of the nanowires. In order to do so, the nanowires need to be released from the underlying substrate (which in this present example is the underlying BOX 106) in order to expose a surface around each of the nanowires on which the gate(s) can be formed.

The nanowires may be released from the underlying BOX 106 by undercutting the BOX 106 beneath the nanowires using an isotropic etching process using, e.g., a diluted hydrofluoric acid (DHF). A 100:1 DHF etches approximately 2 nm to 3 nm of BOX layer 106 per minute at room temperature. As a result, the nanowires are now suspended over the BOX 106. See FIG. 2, described below.

Further processing, if so desired may now be employed, to re-shape and/or thin the nanowires. Re-shaping will smoothen the nanowires giving them an elliptical and in some cases a circular cross-sectional shape. The smoothing of the nanowires may be performed, for example, by annealing the nanowire cores in a hydrogen-containing atmosphere. Exemplary annealing temperatures may be from about 600 degrees Celsius (° C.) to about 1,000° C., and a hydrogen pressure of from about 600 torr to about 700 torr may be employed. Exemplary techniques for suspending and re-shaping nanowires may be found, for example, in U.S. Pat. No. 7,884,004, the contents of which are incorporated by reference herein. During this smoothing process, the nanowire cores are thinned. According to one exemplary embodiment, the nanowires at this stage have an elliptical cross-sectional shape with a cross-sectional diameter of from about 7 nm to about 35 nm.

Thinning of the nanowires may be accomplished using a high-temperature (e.g., from about 700° C. to about 1,000° C.) oxidation of the nanowires followed by etching of the grown oxide. The oxidation and etching process may be repeated x number of times to achieve desired nanowire dimensions. According to one exemplary embodiment, the nanowires at this stage after being further thinned have a cylindrical cross-sectional shape with a cross-sectional diameter of from about 2 nm to about 20 nm, e.g., from about 3 nm to about 10 nm. Thinning the nanowires serves to increase the spacing between adjacent nanowires (i.e., nanowire-to-nanowire spacing).

Next, gate stacks are formed surrounding a portion of each of the nanowires. As highlighted above, the portions of the nanowires surrounded by the gates will serve as channel regions of the device(s), and portions of the nanowires extending out form the gates and the pads will serve as source and drain regions of the device(s). As also highlighted above, and as will be described in detail below, the gate stacks will each contain a work function setting material, an amount of which (by way of the present fabrication process) is proportional to the nanowire pitch of the device. The work function setting material (i) acts as a doping source, and by way of the present process serves to change the work function of the gate stacks, and (ii) will diffuse into the surrounding dielectric and gate material to change the threshold voltage of the device. To help illustrate the gate fabrication process, the perspective of the figures will now shift to a cross-sectional cut through the nanowires, e.g., a cut along line A1-A2—see FIG. 1. The nanowires in the cross-sectional views are shown enlarged as compared to FIG. 1 in order to better illustrate the various layers of the gate stack deposition.

The first step in the gate stack fabrication process is to form an interfacial oxide 202a/202b surrounding each of the nanowires 102a/102b, respectively. See FIG. 2. The interfacial oxide prepares the nanowires for the subsequent deposition of a high-k gate dielectric (see below). The interfacial oxide will form, for example, by exposing the wafer to an oxygen-containing environment. By way of example only, when the nanowires are formed from silicon, the interfacial oxide formed in this step would contain silicon dioxide ($SiO_2$). According to an exemplary embodiment, the interfacial oxide is formed to a thickness $t_{io}$ (see FIG. 2) of from about 0.5 nm to about 3 nm.

A conformal gate dielectric 204a/204b is then deposited on the interfacial oxide 202a/202b, respectively, surrounding each of the nanowires. See FIG. 2. According to an exemplary embodiment, the gate dielectric 204a/204b is formed from a high-k dielectric material, such as hafnium oxide, hafnium silicon-oxynitride, or hafnium silicon-nitride. Suitable conformal deposition processes include, but are not limited to chemical vapor deposition (CVD). By way of example only, the gate dielectric 204a/204b is deposited to a thickness $t_{gd}$ (see FIG. 2) of from about 1 nm to about 5 nm.

Figure 2:
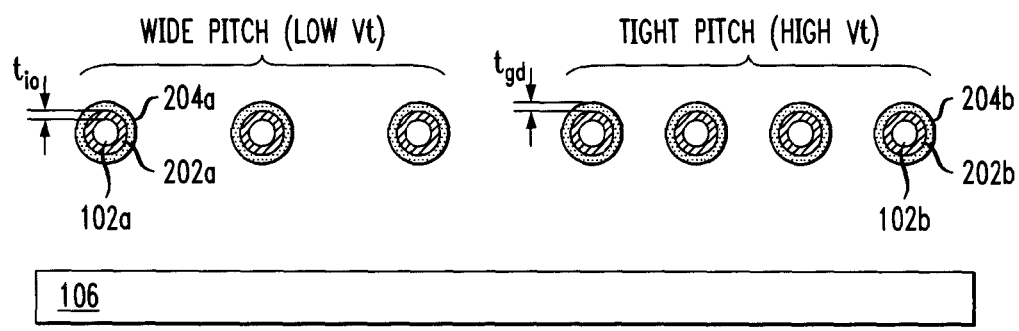
FIG. 2 is a cross-sectional diagram illustrating an interfacial oxide having been formed around the nanowires and conformal gate dielectric having been deposited over the interfacial oxide according to an embodiment of the present invention.

Further, as highlighted above, the nanowires have been suspended over the BOX 106 in order to permit GAA devices to be formed (i.e., wherein the gate fully surrounds at least a portion of each of the nanowire (channels)). As provided above, the nanowires can be suspended by recessing the BOX 106 beneath the nanowires. This recessed BOX 106 is depicted in FIG. 2.

Figure 3:
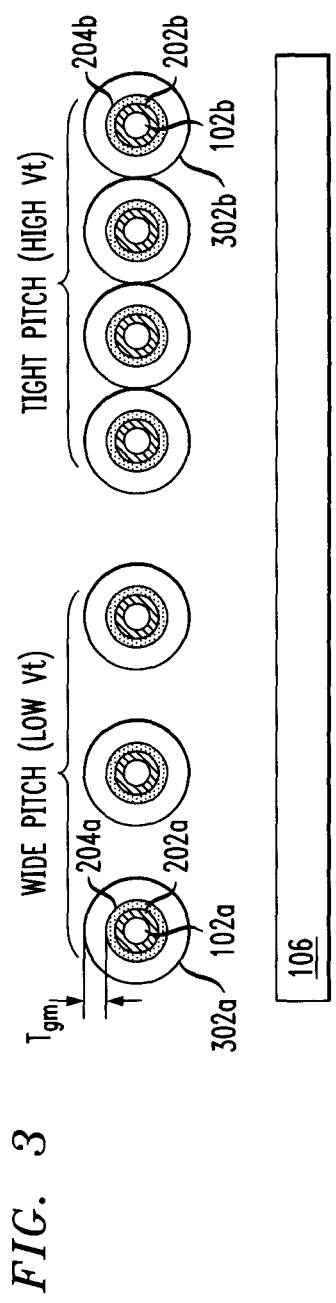
FIG. 3 is a cross-sectional diagram illustrating a conformal first gate material having been deposited on the gate dielectric according to an embodiment of the present invention.

Next, as shown in FIG. 3, a conformal first gate material 302a/302b is deposited on the gate dielectric 204a/204b, respectively, surrounding each of the nanowires. According to an exemplary embodiment, the first gate material consists of a single layer or multiple layers of a gate metal(s) such as titanium and/or tantalum, e.g., titanium nitride and/or tantalum nitride, and combinations including at least one of the foregoing metals. Suitable deposition processes for conformally depositing the first gate material (especially in the case of titanium and tantalum gate metals) include, but are not limited to CVD.

As will be described in detail below, a work function setting material(s) will be deposited onto the first gate material (e.g., metal(s)). The work function setting material acts as a doping source, and by way of the present process serves to change the work function of the gate stacks. Since the work function setting material acts as a doping source, advantageously, the present process flow permits the same gate metal to be used in each of the devices being formed (which simplifies the fabrication process). A different work function setting material can then be employed depending, e.g., on whether an n-channel nanowire FET or a p-channel nanowire FET is desired. Further, the gate metal will diffuse into the surrounding dielectric to change the threshold voltage of the device. In one exemplary embodiment, the more metal present in the gate, the lower the threshold voltage ($V_T$) of the device. Thus, by adding a work function setting material to the gate stack, the threshold voltages of the resulting devices can be modulated. By way of the present techniques, more of the work function setting material will be deposited in the wide pitch devices as compared to the tight pitch devices. By modulating the volume of work function setting material proportionally to the nanowire pitch such that the volume of work function setting material is reduced as nanowire pitch decreases, multiple thresholds nanowire FET devices can be fabricated simultaneously.

Accordingly, the volume of the gate material and the volume of the work function setting material (to be deposited as described below) are important parameters to the present process. According to the present techniques, the volume of these materials is quantified based on the thickness of these layers. By way of example only, as shown in FIG. 3, the first gate material 302a/302b is deposited to a thickness $T_{gm}$ of (i.e., a uniform thickness across all of the devices) from about 2 nm to about 20 nm.

Figure 4:
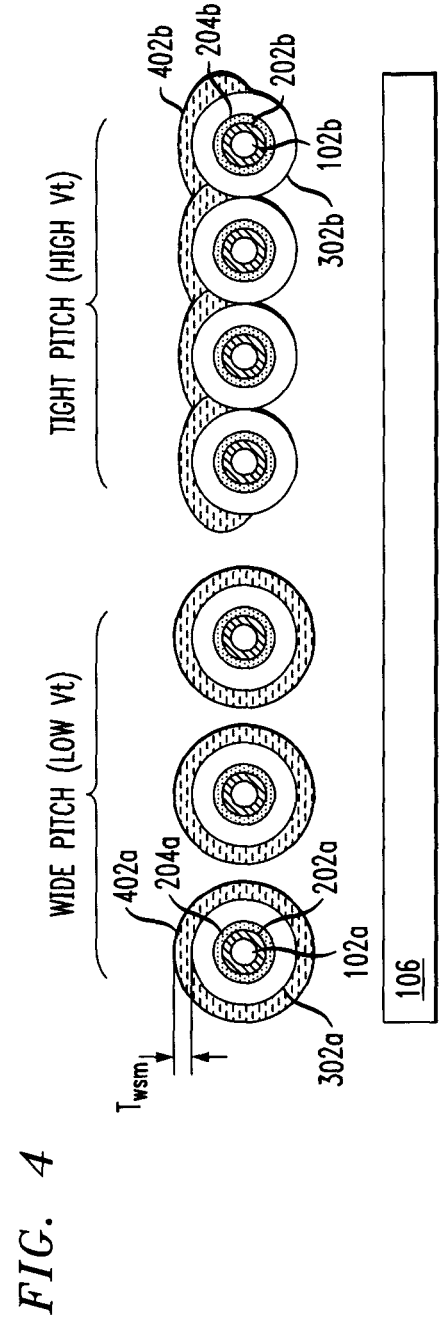
FIG. 4 is a cross-sectional diagram illustrating a work function setting material having been deposited on the first gate material according to an embodiment of the present invention.
Figure 5:
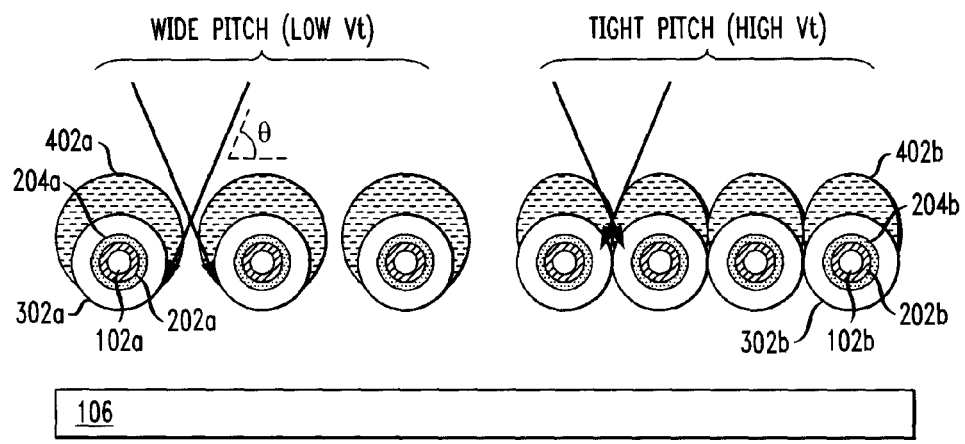
FIG. 5 is a cross-sectional diagram illustrating work function setting material having been deposited on the first gate material using an angled deposition process according to an embodiment of the present invention.

Next, as shown in FIG. 4, work a function setting material 402a/402b is deposited on the first gate material 302a/302b, respectively, at least partially surrounding each of the nanowires. As provided above, the work function setting material acts as a doping source, and a different work function setting material can then be employed depending on whether an n-channel nanowire FET or a p-channel nanowire FET device is desired. Thus, the same first gate material 302a/302b (e.g., titanium nitride or tantalum nitride) can be used in each of the devices, yet a different (if so desired) work function setting material can be used in one or more devices to obtain a different doping polarity. By way of example only, suitable work function setting materials for use in p-channel nanowire FET devices include, but are not limited to aluminum, dysprosium, gadolinium, and ytterbium. Suitable work function setting materials for use in n-channel nanowire FET devices include, but are not limited to lanthanum, titanium, and tantalum. Suitable deposition processes for depositing the work function setting material(s) include, but are not limited to CVD. Conventional CVD processes can be tuned to deposit differently on tight pitch and wide pitch nanowires by, for example, operating in a flow-limited regime where the flow of reactants and by-products is more restricted in the space between nanowires at a tight fin pitch. Alternatively, as will be described in detail below, an angled work function metal deposition process, such as evaporation or sputtering, may be employed so as to further control the amount of work function setting material deposited in proportion to the nanowire pitch.

As also described above, the work function setting material serves to modulate the threshold voltage ($V_T$) of the device. In one exemplary embodiment, the work function setting material serves to lower the threshold voltage ($V_T$) of the device. By way of the present process, the work function setting material(s) can be deposited to a given thickness ($T_{wsm}$, see FIG. 4) on all devices (e.g., to a thickness of from about 5 nm to about 20 nm), but because of the configuration of the gate stacks, the volume of work function setting material present in each gate stack will be proportional to the pitch of the nanowires. See for example in FIG. 4 where it is shown that a greater volume of work function setting material is present in the wide pitch nanowire FET versus the tight pitch nanowire FET. The present techniques rely on using the nanowire pitch variation to intentionally vary the amount (volume) of the work function setting material. Therefore, the amount (volume) of the work function setting material is varied by having a different size gap for the work function setting material to fill in as a function of nanowire pitch. Namely, as shown in FIG. 4, the work function setting material 402a deposited on the wide pitch nanowire FET surrounds each of the nanowires, while the work function setting material 402b deposited on the tight pitch nanowire FET (due to the tight pitch of the nanowires) only surrounds a portion of each of the nanowires (partially surrounds). As a result, the overall amount of the work function setting material surrounding the nanowires in the tight pitch device is less than the amount of the work function setting material surrounding the nanowires in the wide pitch device. The spacing between the nanowires (based on the pitch of the nanowires) limits the amount of the work function setting material that can be deposited between the nanowires. If so desired, it is not necessary to vary the composition of the work function setting material used in the devices, and embodiments are anticipated herein where the same work function setting material (deposited, e.g., to the same thickness) is used in each of the work function setting material layers 402a and 402b. It is notable that nanowires on the ends of the ladder (the end devices), i.e., the first and last nanowires, might get more material since they might not have a structure adjacent to them to provide a limited gap for deposition (such as the gap present between the nanowires). However, nanowire FETs generally have several nanowires in parallel (10-20 nanowires), so the impact of the first/last nanowire will be lessened through averaging.

As described above, an angled deposition process may be employed to deposit the work function setting material. By way of example only, suitable angled deposition processes include, but are not limited to evaporation or collimated sputtering. By employing an angled deposition process, less of the work function setting material will get deposited in the tighter pitch devices. See FIG. 5. Specifically, FIG. 5 which follows from FIG. 3 (as an alternate to the deposition process used to deposit the work function setting material in FIG. 4) illustrates how when an angled deposition process is used to deposit the work function setting material, less of the work function setting material gets deposited between the tight pitch devices as compared to the wide pitch devices. The reason for this variable deposition amount is that, depending on the angle of deposition, adjacent gate stacks will "shadow" each other. In this example, with a deposition angle θ of from about 5 degrees to about 45 degrees, the gate stacks in the tight pitch devices will shadow each other resulting in a lesser amount of the work function setting material getting deposited between the gate stacks in these devices (as compared to the wide pitch devices).

The remainder of the gate stack which, according to an exemplary embodiment, consists of a second gate material 602a/602b (e.g., with the conformal gate material 302a/302b constituting the first gate material) being blanket deposited onto the structure (i.e., over the work function setting material so as to surround the nanowires). This second gate material may be a single layer or may include multiple layers such as, but not limited to, a layer of material that is the same as the first gate material, poly silicon, and/or a dielectric capping layer such as silicon nitride. For illustrative purposes, the deposition of the second gate material is represented in conjunction with the embodiment where a non-angled deposition of the work function setting material is employed. Thus, the structure shown in FIG. 6 follows from that shown in FIG. 4. However, this is merely exemplary, and the second gate material could in the same manner be formed on the (angle deposited work function setting material) structure of FIG. 5.

Figure 6:
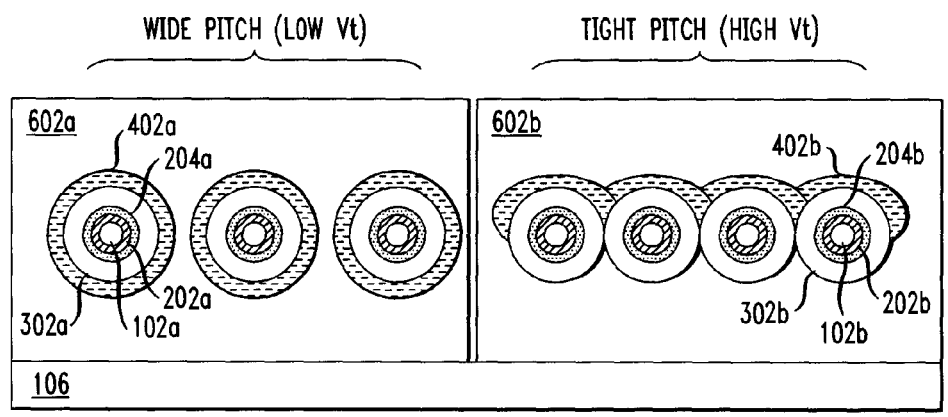
FIG. 6 is a cross-sectional diagram illustrating a complete gate stack having been deposited onto the structure, surrounding the nanowires according to an embodiment of the present invention.

In the exemplary embodiment shown illustrated in FIG. 6, an amount of the second gate material deposited in this step is such that each of the nanowires is fully encapsulated (i.e., as opposed to conformally surrounding each of the nanowires individually as with the first gate material). As would be apparent to one of skill in the art, this result may be accomplished based simply on the amount of material deposited. Thus, for example, using a deposition process like CVD, the second gate material would first form conformally around the nanowires, then as more material is deposited, the second gate material will encapsulate and bury the nanowires under a continuous layer of the material. Thus, the resulting structure shown in FIG. 6 can be achieved simply by varying the deposition time (and hence the amount of material deposited).

Figure 7:
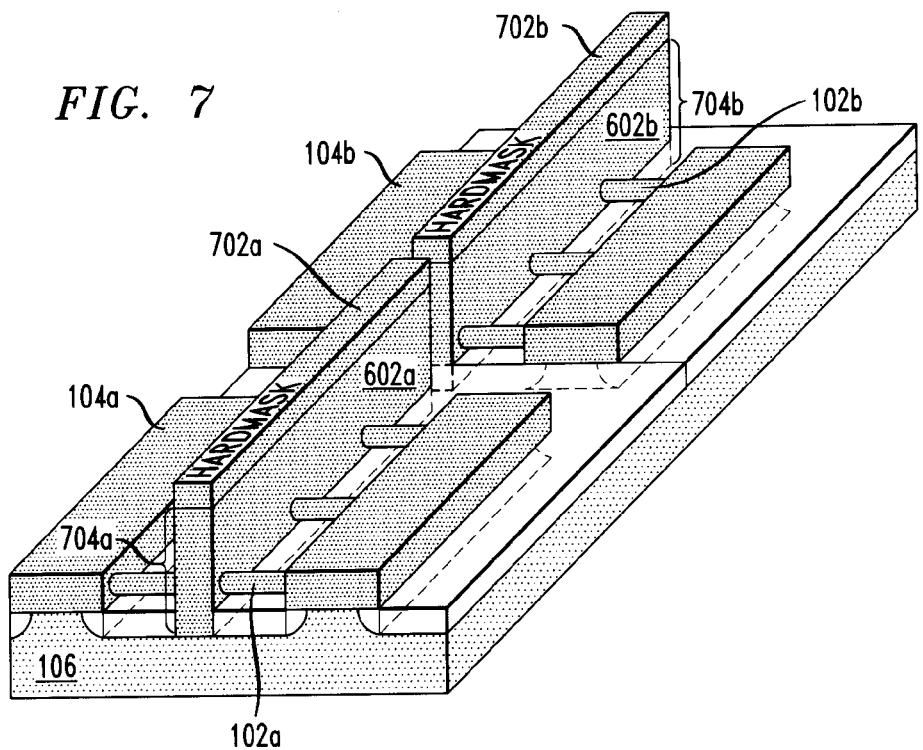
FIG. 7 is a three-dimensional diagram illustrating gate stacks having been patterned into gate lines surrounding the nanowires in a gate all around configuration according to an embodiment of the present invention.

To facilitate illustration of the remainder of the process, the perspective of the figures will now shift to a three-dimensional depiction of the device structure. By way of reference to FIG. 7, a hardmask 702a/702b (e.g., a nitride hardmask, such as silicon nitride (SiN)) may then be formed on the second gate material 602a/602b, respectively, wherein the hardmasks correspond to a gate line of the device. Standard patterning techniques can be used to form the hardmask 702a/702b. The gate material(s), work function setting material and dielectric(s) are then etched by directional etching that results in straight sidewalls of the gate stack 704a/704b, as shown in FIG. 7. An isotropic lateral etch is then performed to remove residue of the gate materials underneath nanowires, shadowed from the first directional etching (not shown). This process could be accomplished by RIE or a chemical wet etch. After the lateral etching step, formation of the patterned gate stacks 704a/704b over the suspended nanowires is complete.

Figure 8:
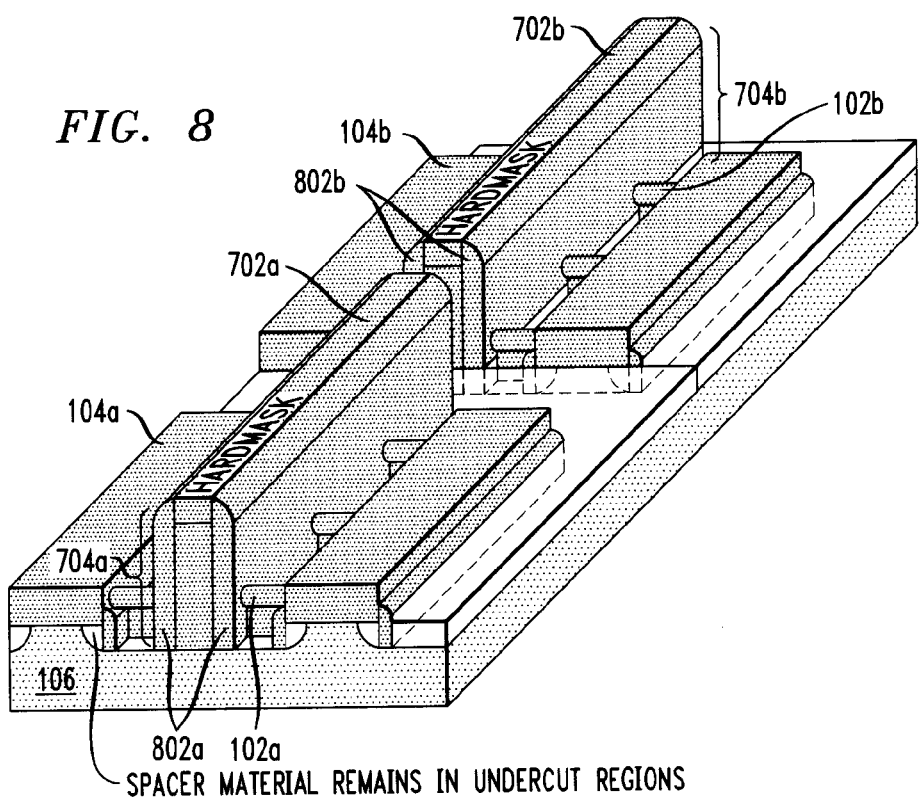
FIG. 8 is a three-dimensional diagram illustrating spacers having been formed on opposite sides of the gate stack according to an embodiment of the present invention.
Figure 9:
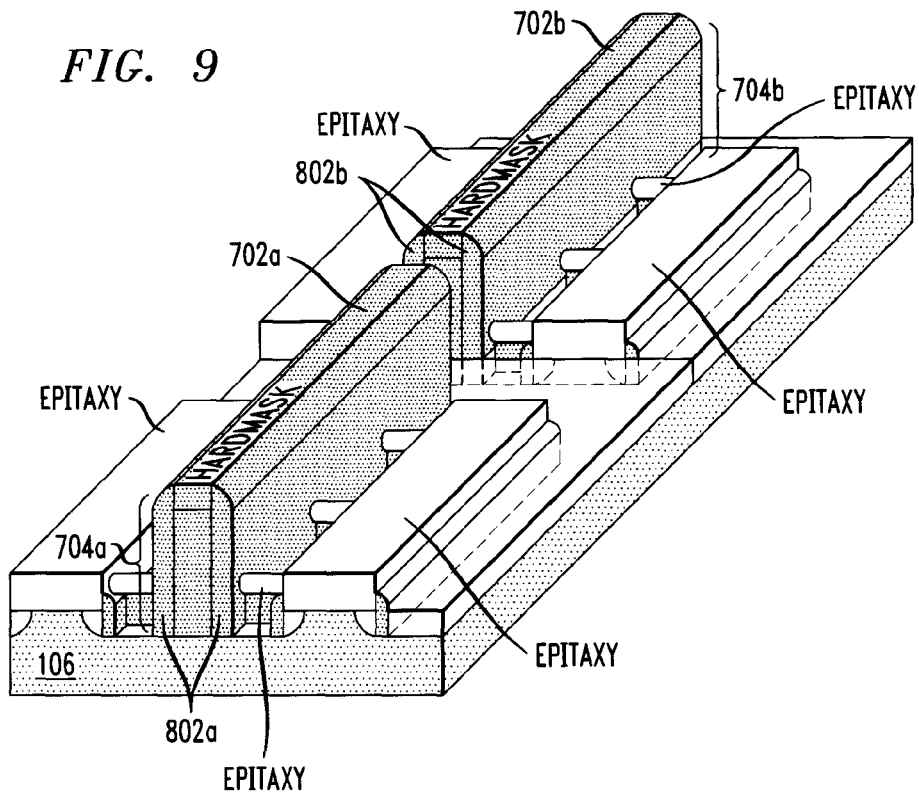
FIG. 9 is a three-dimensional diagram illustrating selective epitaxial growth having been used to thicken the exposed portions of the nanowires and pads according to an embodiment of the present invention.
Figure 10:
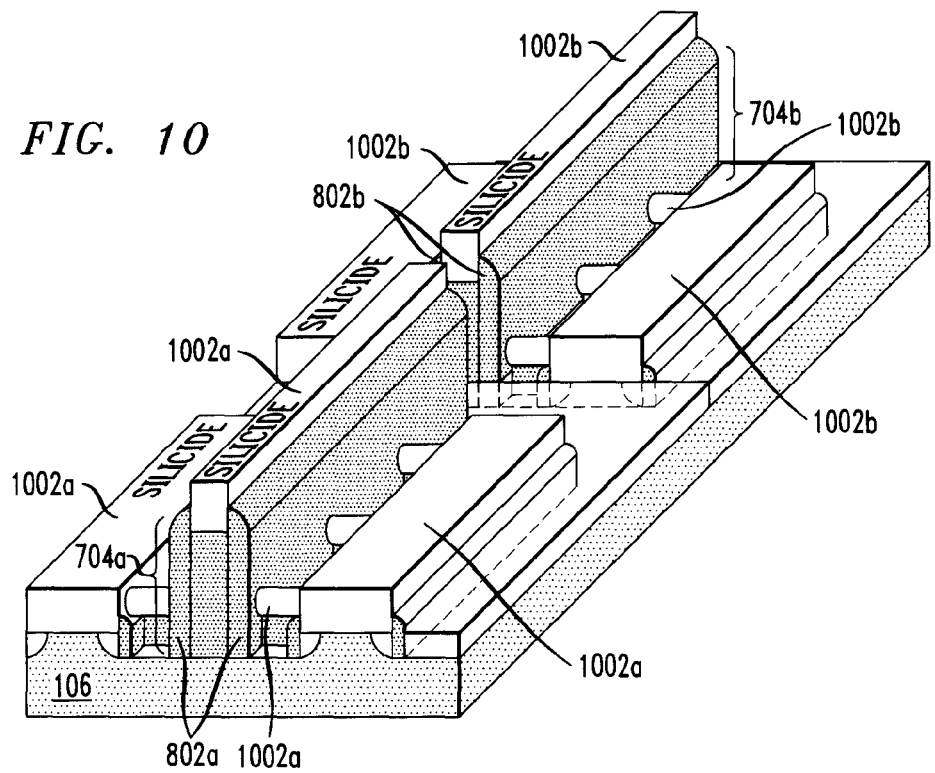
FIG. 10 is a three-dimensional diagram illustrating a contact material having been formed on the exposed epitaxial material according to an embodiment of the present invention.

Spacers 802a/802b are formed on opposite sides of gate stack 704a/704b. See FIG. 8. According to an exemplary embodiment, spacers 802a/802b are formed by depositing a blanket dielectric film such as silicon nitride and etching the dielectric film from all horizontal surfaces by RIE. As shown in FIG. 8, some of the deposited spacer material can remain in the undercut regions, since the RIE in that region is blocked by the pads.

Next a selective epitaxial material (labeled "Epitaxy") such as Si, SiGe, or SiC is then grown on the exposed portions of the nanowires and pads (i.e., those portions not covered by a gate stack or spacers) to thicken the exposed portions of the nanowires and pads. See FIG. 9. The growth process might involve epitaxially growing, for example, in-situ doped Si, SiGe or SiC that may be either n-type or p-type doped. By way of example only, a chemical vapor deposition (CVD) reactor may be used to perform the epitaxial growth. For example, for silicon epitaxy, precursors include, but are not limited to, $SiCl_4$, $SiH_4$ combined with HCL. The use of chlorine allows selective deposition of silicon only on exposed silicon. A precursor for SiGe growth may be $GeH_4$, which may obtain deposition selectivity without HCL. Precursors for dopants may include $PH_3$ or $AsH_3$ for n-type doping and $B_2H_6$ for p-type doping. Deposition temperatures may range from about 550° C. to about 1,000° C. for pure silicon deposition, and as low as 300° C. for pure Ge deposition.

Finally, a contact material, in this case a silicide 1002a/1002b (formed from the epitaxial Si, SiGe or SiC) is formed on the exposed epitaxial material (i.e., the epitaxial material on the pads and portions of the nanowires that extend out from the gate stack). See FIG. 10. Examples of contact materials include, but are not limited to, nickel silicide or cobalt silicide. By way of example only, formation temperatures can be from about 400° C. to about 600° C. The silicide process involves reacting a deposited metal(s) (such as nickel and/or cobalt) with silicon (e.g., the epitaxial silicon formed in the previous step).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A nanowire field effect transistor (FET) device, comprising:
a semiconductor-on-insulator (SOI) wafer comprising a SOI layer over a buried oxide (BOX), and a plurality of nanowires and pads patterned in the SOI layer wherein the pads are attached at opposite ends of the nanowires in a ladder-like configuration, and wherein the nanowires are suspended over the BOX, and wherein the nanowires patterned in the SOI layer have a pitch comprising at least a first pitch, and at least a second pitch that is different from the first pitch;
an interfacial oxide surrounding each of the nanowires; and
gate stacks surrounding the nanowires, such that at least a first one of the gate stacks corresponding to at least one first nanowire FET is formed over the nanowires having the first pitch and at least a second one of the gate stacks corresponding to at least one second nanowire FET is formed over the nanowires having the second pitch, each of the gate stacks having (i) a conformal gate dielectric present on the interfacial oxide, surrounding the nanowires (ii) a conformal first gate material on the conformal gate dielectric, surrounding the nanowires (iii) a work function setting material on the conformal first gate material, at least partially surrounding the nanowires, and (iv) a second gate material on the work function setting material, surrounding the nanowires,
wherein a volume of the conformal first gate material and a volume of the conformal work function setting material in the gate stacks are proportional to the pitch of the nanowires, wherein the work function setting material is configured to change threshold voltages of the device, and wherein, by way of the volume of the work function setting material in the gate stacks being proportional to the pitch of the nanowires, the first nanowire FET comprising the first one of the gate stacks formed over the nanowires having the first pitch has a different threshold voltage from the second nanowire FET comprising the second one of the gate stacks formed over the nanowires having the second pitch.

2. The nanowire FET of claim 1, wherein the nanowires and the pads comprise a semiconductor material selected from the group consisting of: silicon, silicon germanium and silicon carbon.

3. The nanowire FET of claim 1, wherein the interfacial oxide has a thickness of from about 0.5 nanometers to about 3 nanometers.

4. The nanowire FET of claim 1, wherein the conformal gate dielectric comprises a high-k dielectric material.

5. The nanowire FET of claim 4, wherein the high-k dielectric material is selected from the group consisting of: hafnium oxide, hafnium silicon-oxynitride, and hafnium silicon-nitride.

6. The nanowire FET of claim 1, wherein the conformal gate dielectric has a thickness of from about 1 nanometer to about 5 nanometers.

7. The nanowire FET of claim 1, wherein the conformal first gate material comprises a metal.

8. The nanowire FET of claim 7, wherein the metal is selected from the group consisting of: titanium, titanium nitride, tantalum, tantalum nitride, and combinations comprising at least one of the foregoing metals.

9. The nanowire FET of claim 1, wherein the conformal first gate material has a thickness of from about 2 nanometers to about 20 nanometers.

10. The nanowire FET of claim 1, wherein the nanowire FET comprises a p-channel FET and wherein the work function setting material comprises aluminum, dysprosium, gadolinium, or ytterbium.

11. The nanowire FET of claim 1, wherein the nanowire FET comprises an n-channel FET and wherein the work function setting material comprises lanthanum, titanium, or tantalum.

12. The nanowire FET of claim 1, wherein the second gate material comprises polysilicon.

13. The nanowire FET of claim 1, further comprising:
spacers on opposite sides of the gate stack.

14. The nanowire FET of claim 13, wherein the spacers comprise silicon nitride.

15. The nanowire FET of claim 1, wherein the BOX is undercut beneath the nanowires.

16. The nanowire FET of claim 1, further comprising:
an epitaxial material grown on exposed portions of the nanowires and pads.

17. The nanowire FET of claim 16, further comprising:
a contact material formed on the epitaxial material.

18. The nanowire FET of claim 17, wherein the contact material comprises a silicide.

* * * * *